(12) United States Patent
Hsueh et al.

(10) Patent No.: US 9,437,655 B2
(45) Date of Patent: Sep. 6, 2016

(54) MAGNETIC TUNNEL JUNCTION WITH SUPERLATTICE BARRIERS

(71) Applicant: NATIONAL TAIWAN UNIVERSITY, Taipei (TW)

(72) Inventors: Wen-Jeng Hsueh, Taipei (TW); Chang-Hung Chen, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 14/460,358

(22) Filed: Aug. 15, 2014

(65) Prior Publication Data

US 2015/0214275 A1 Jul. 30, 2015

Related U.S. Application Data

(60) Provisional application No. 61/931,235, filed on Jan. 24, 2014.

(51) Int. Cl.
*G11B 5/39* (2006.01)
*H01L 27/22* (2006.01)
*H01L 43/08* (2006.01)

(52) U.S. Cl.
CPC ........... *H01L 27/228* (2013.01); *G11B 5/3909* (2013.01); *H01L 43/08* (2013.01)

(58) Field of Classification Search
CPC ....... H01L 43/12; H01L 43/08; H01L 29/82; H01L 43/10; H01L 27/226; H01L 27/228; H01L 43/02; G11C 11/16; G11C 11/161; G11B 5/3909; G01R 33/098
USPC ............... 257/295, 421, 425, 427; 360/324.2
See application file for complete search history.

(56) References Cited

U.S. PATENT DOCUMENTS

| | | | | |
|---|---|---|---|---|
| 4,665,412 A | * | 5/1987 | Ohkawa et al. | 257/17 |
| 5,636,093 A | * | 6/1997 | Gijs et al. | 360/125.5 |
| 6,323,525 B1 | * | 11/2001 | Noguchi | H01L 21/2257 257/344 |
| 6,347,049 B1 | * | 2/2002 | Childress et al. | 365/173 |
| 6,756,128 B2 | * | 6/2004 | Carey | B82Y 10/00 360/324 |
| 6,760,201 B2 | * | 7/2004 | Nakashio | B82Y 10/00 257/E27.005 |
| 6,849,464 B2 | * | 2/2005 | Drewes | B82Y 25/00 257/E21.281 |

(Continued)

FOREIGN PATENT DOCUMENTS

EP 2568305 A1 * 3/2013
WO WO 9611469 A1 * 4/1996

OTHER PUBLICATIONS

"Resonant Tunneling Through a Double GaAs/AlAs Superlattice Barrier, Single Quantum Well Heterostructure", by M. A. Reed, J. W. Lee, and H-L. Tsai, Appl. Phys. Lett., vol. 49, No. 3, Jul. 21, 1986, pp. 158-160.*

*Primary Examiner* — Will J Klimowicz
(74) *Attorney, Agent, or Firm* — The PL Law Group, PLLC

(57) ABSTRACT

A magnetic tunnel junction is provided. The magnetic tunnel junction can enhance the tunnel magnetoresistance ratio and a device including the magnetic tunnel junction. The magnetic tunnel junction includes: a pinned layer; a free layer; and a superlattice barrier, the barrier configured between the pinned layer and the free layer. The magnetic tunnel junction may be a series or parallel connection of the above-mentioned basic form. The device including a magnetic tunnel junction may be a magnetic random access memory bit cell, a magnetic tunnel junction transistor device, a magnetic field sensor, etc.

6 Claims, 16 Drawing Sheets

(56) References Cited

U.S. PATENT DOCUMENTS

| | | | | |
|---|---|---|---|---|
| 7,479,394 B2* | 1/2009 | Horng | ................... | B82Y 25/00 257/E21.665 |
| 7,488,609 B1* | 2/2009 | Lin | ....................... | B82Y 10/00 257/E21.663 |
| 7,679,155 B2* | 3/2010 | Korenivski | ........... | B82Y 25/00 257/421 |
| 7,888,756 B2* | 2/2011 | Mather | ................. | B82Y 10/00 257/421 |
| 8,373,948 B2* | 2/2013 | Zeltser | ................. | B82Y 10/00 360/324.2 |
| 8,796,796 B2* | 8/2014 | Watts et al. | ................... | 257/421 |
| 2002/0097534 A1* | 7/2002 | Sun et al. | ................ | 360/324.2 |
| 2004/0091744 A1* | 5/2004 | Carey et al. | ................... | 428/693 |
| 2005/0163985 A1* | 7/2005 | Dorfman | ................ | C01B 31/02 428/216 |
| 2007/0111332 A1* | 5/2007 | Zhao | ...................... | B82Y 10/00 438/3 |
| 2008/0061388 A1* | 3/2008 | Diao et al. | .................... | 257/421 |
| 2008/0170337 A1* | 7/2008 | Hirata et al. | ................ | 360/324.2 |
| 2008/0232002 A1* | 9/2008 | Mather et al. | ............. | 360/324.2 |
| 2009/0268351 A1* | 10/2009 | Zeltser | ...................... | 360/324.2 |
| 2012/0128870 A1* | 5/2012 | Zhao et al. | ................... | 427/130 |
| 2013/0175644 A1* | 7/2013 | Horng | .................... | H01L 43/12 257/421 |
| 2013/0234266 A1* | 9/2013 | Prejbeanu et al. | ........... | 257/421 |
| 2014/0027869 A1* | 1/2014 | Lee et al. | ...................... | 257/421 |
| 2014/0154528 A1* | 6/2014 | Sankar et al. | ............. | 428/811.1 |

* cited by examiner

1200

MAGNETIC TUNNEL JUNCTION WITH SUPERLATTICE BARRIERS

CROSS-REFERENCE TO RELATED APPLICATION AND CLAIM OF PRIORITY

This application claims the benefit of U.S. Provisional Application No. 61/931,235, filed on Jan. 24, 2014, in the United States Patent and Trademark Office, the disclosures of which are incorporated herein in their entirety by reference.

FIELD OF THE INVENTION

The invention relates to a magnetic tunnel junction (MTJ), and more particularly to a MTJ for use in magnetic random access memories, transistor devices and magnetic field sensors.

BACKGROUND OF THE INVENTION

A typical magnetic tunnel junction has a sandwich structure F/I/F, where F indicates a ferromagnet and I indicates an insulating barrier. Currently, the mainstream structure of the insulating barrier is a single insulator material. The structure above is called a single-barrier structure, and the tunnel magnetoresistance (TMR) ratio can reach about $10^2$%. Recently, double-barrier structures (e.g. F/I/F/I/F or F/I/N/I/F, where N is a metal) were proposed. The TMR ratio of a double-barrier structure can reach about $10^3$%. The barrier layer of a magnetic tunnel junction must be thin enough to allow the tunnel effect in quantum mechanics.

A magnetic tunnel junction is an important component when designing hard disk read heads and magnetic random access memories, while the TMR ratio is an important indicator to assess the magnetic tunnel junction. For example, a magnetic tunnel junction with a higher TMR ratio can enhance the sensitivity of the hard disk read head, and thereby enhance the capacity of the hard disk. Another example is the magnetic field sensor. At present, the most sensitive magnetic field sensor is the superconducting quantum interference device (SQUID). However, the SQUID must operate at very low temperatures, and thus liquid nitrogen is needed. Through improving the sensitivity of the MTJ, we have the opportunity to obtain a magnetic field sensor which is as sensitive as the SQUID and has the advantage of working at room temperature.

Another structure similar to the magnetic tunnel junction is the giant magnetoresistance (GMR) structure. The GMR structure does not have a barrier, and thus no tunnel effect is involved. The typical material of its middle layer is a conductor. The GMR structure has a similar indicator: the magnetoresistance ratio. The magnetoresistance ratio of a GMR structure can reach about $10^2$%.

After the magnetic tunnel junction was invented in 1995, it has been an important issue to design a magnetic tunnel junction with a higher TMR ratio. The goal of the present invention is to provide a magnetic tunnel junction with high TMR ratio.

In order to overcome the drawbacks in the prior art, a magnetic tunnel junction with superlattice barriers is provided. The particular design in the present invention not only solves the problems described above, but is also easy to implement. Thus, the present invention has utility for the industry.

SUMMARY OF THE INVENTION

A research paper related to the present invention was published in APPLIED PHYSICS LETTERS 104, 042405 (2014), Jan. 30, 2014. The new technique proposed in the present invention utilizes a superlattice-barrier (SLB) structure to replace the traditional single-barrier and double-barrier ones. The TMR ratio of the superlattice-barrier structure can be enhanced to reach $10^5$%.

In accordance with an aspect of the present invention, a magnetic tunnel junction (MTJ) is provided. The MTJ includes: a plurality of pinned layers; a plurality of barriers, wherein at least one of the plurality of barriers is a superlattice barrier, the plurality of barriers are alternately stacked in pairs with the plurality of pinned layers, and an outermost barrier of the plurality of barriers has an outer side; and a free layer configured on the outer side.

In accordance with a further aspect of the present invention, a magnetic tunnel junction (MTJ) is provided. The MTJ includes: a first part including a plurality of first pinned layers and a plurality of first barriers, wherein the plurality of first pinned layers and the plurality of first barriers are alternately stacked in pairs; a second part including a plurality of second pinned layers and a plurality of second barriers, wherein the plurality of second pinned layers and the plurality of second barriers are alternately stacked in pairs; and a free layer configured between the plurality of first barriers and the plurality of second barriers, wherein at least one of the plurality of first barriers and the plurality of second barriers is a superlattice barrier, and the stacked first part, the free layer and the second part are aligned along a line, which is defined as a horizontal line.

In accordance with another aspect of the present invention, a magnetic random access memory bit cell is provided, the magnetic random access memory bit cell including: a transistor; and a magnetic tunnel junction connected to the transistor, wherein the magnetic tunnel junction includes a pinned layer, a free layer and a superlattice barrier configured between the pinned layer and the free layer.

In accordance with another aspect of the present invention, a magnetic tunnel junction transistor device is provided, the magnetic tunnel junction transistor device including: a first electrode; a gate electrode; and a magnetic tunnel junction configured between the first electrode and the gate electrode and including a pinned layer, a free layer and a superlattice barrier configured between the pinned layer and the free layer.

In accordance with another aspect of the present invention, a magnetic field sensor is provided, the magnetic field sensor including: a magnetic tunnel junction including a pinned layer, a free layer and a superlattice barrier configured between the pinned layer and the free layer.

In accordance with another aspect of the present invention, a magnetic tunnel junction is provided, the magnetic tunnel junction including: a pinned layer; a free layer; and a periodic middle layer having a plurality of layered units, and configured between the pinned layer and the free layer, wherein each of the plurality of layered units includes at least one barrier layer and at least one potential well layer.

In accordance with another aspect of the present invention, a magnetic tunnel junction (MTJ) is provided. The MTJ includes: a pinned layer; a free layer; and a superlattice barrier configured between the pinned layer and the free layer.

The present invention provides a magnetic tunnel junction with a high TMR ratio, enhanced to reach $10^5$%, and a device including the magnetic tunnel junction with a high TMR ratio, and thus is significant for practical applications.

The aspects and advantages of the present invention will become more readily apparent to those ordinarily skilled in the art after reviewing the following detailed descriptions and accompanying drawings.

DETAILED DESCRIPTION

Figure 1A:
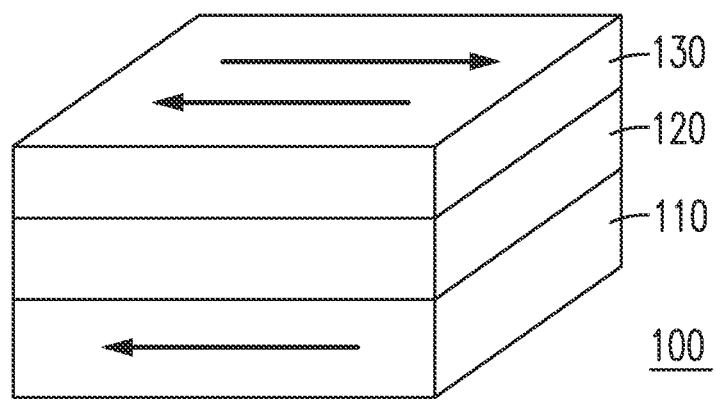
FIG. 1A and FIG. 1B show an embodiment of the basic form of the magnetic tunnel junction of the present invention.

The present invention will now be described more specifically with reference to the following embodiments. It is to be noted that the following descriptions of preferred embodiments of this invention are presented herein for purposes of illustration and description only; it is not intended to be exhaustive or to be limited to the precise form disclosed.

While the present invention is described with reference to the preferred embodiments and examples, it is to be understood that these examples are intended to be illustrative rather than in a limiting sense. It is contemplated that modifications and combinations will readily occur to those skilled in the art, and these modifications and combinations are within the spirit of the invention.

In addition, the present invention can be fully understood from the descriptions of the following embodiments, allowing persons skilled in the art to carry it out accordingly, but the following embodiments of the invention are set forth without any loss of generality to and without imposing limitations upon the claimed invention. The same reference numerals are used to denote the same components throughout.

Figure 1B:
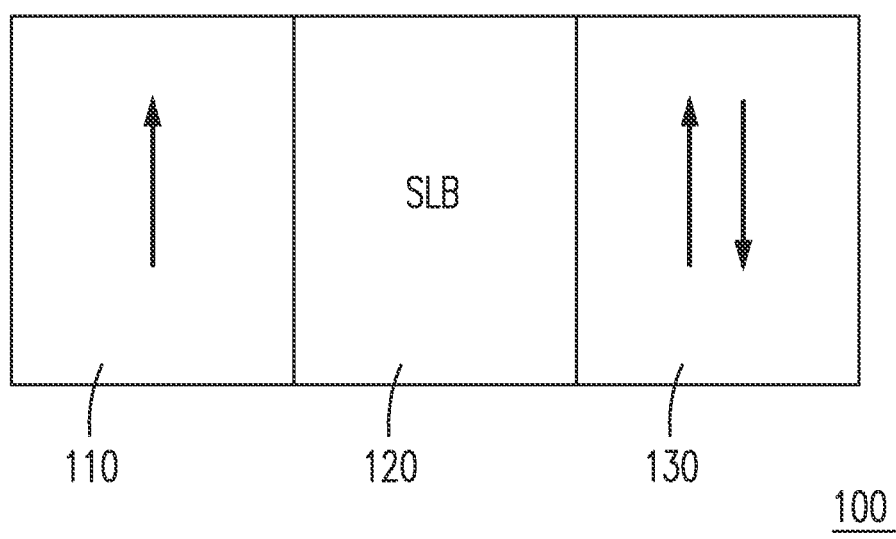
Figure 2A:
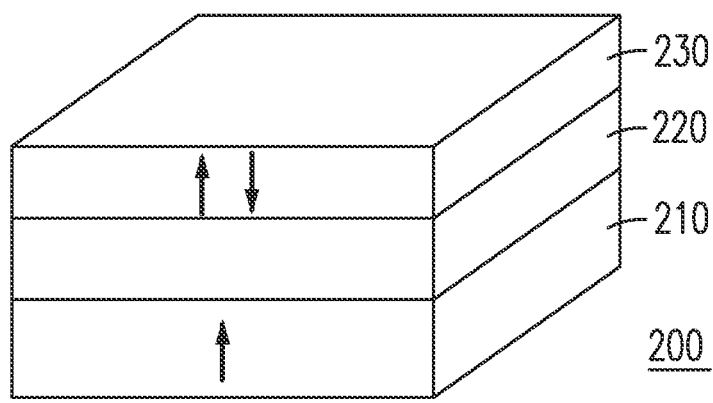
FIG. 2A and FIG. 2B show another embodiment of the basic form of the magnetic tunnel junction of the present invention.
Figure 2B:
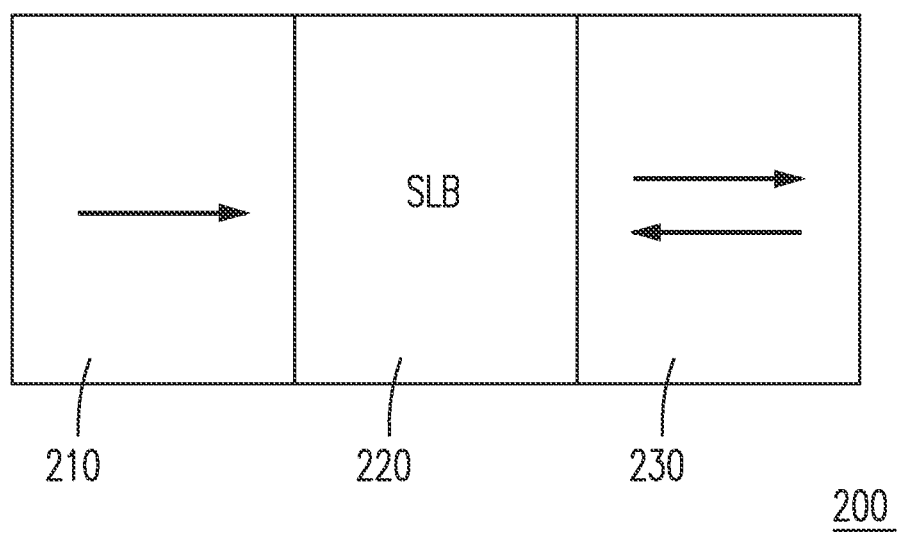

Please refer to FIG. 1A, FIG. 1B, FIG. 2A and FIG. 2B, which show two embodiments of the basic form of the magnetic tunnel junction of the present invention. FIG. 1A shows a magnetic tunnel junction 100, the magnetic tunnel junction 100 including: a pinned layer 110, a superlattice barrier 120 and a free layer 130. The pinned layer 110 has a first magnetization direction (shown by the arrow on the pinned layer 110). The first magnetization direction extends along a line on the plane of the pinned layer 110, and the magnetization direction of the free layer 130 is either the same as or opposite to the first magnetization direction (as shown by the arrows on the free layer 130). FIG. 1B is a 90°-rotated side view, which is not drawn to scale, of the magnetic tunnel junction 100. FIG. 2A shows a magnetic tunnel junction 200. The magnetic tunnel junction 200 includes: a pinned layer 210, a superlattice barrier 220 and a free layer 230. The pinned layer 210 has a second magnetization direction perpendicular to the plane of the pinned layer 210 (as shown by the arrow on the pinned layer 210), and the magnetization direction of the free layer 230 is either the same as or opposite to the second magnetization direction (as shown by the arrows on the free layer 230). FIG. 2B is a 90°-rotated side view, which is not drawn to scale, of the magnetic tunnel junction 200.

Preferably, either one of the pinned layer and the free layer is one of a ferromagnetic material and a semiconductor material, e.g., NiFe, NiFeCo, CoFe, CoFeB, Fe, Co, Ni, Mn, In, As, Ga, InAs, GaAs, GaMnAs, InMnAs, or the alloy or compound of the above.

Figure 3:
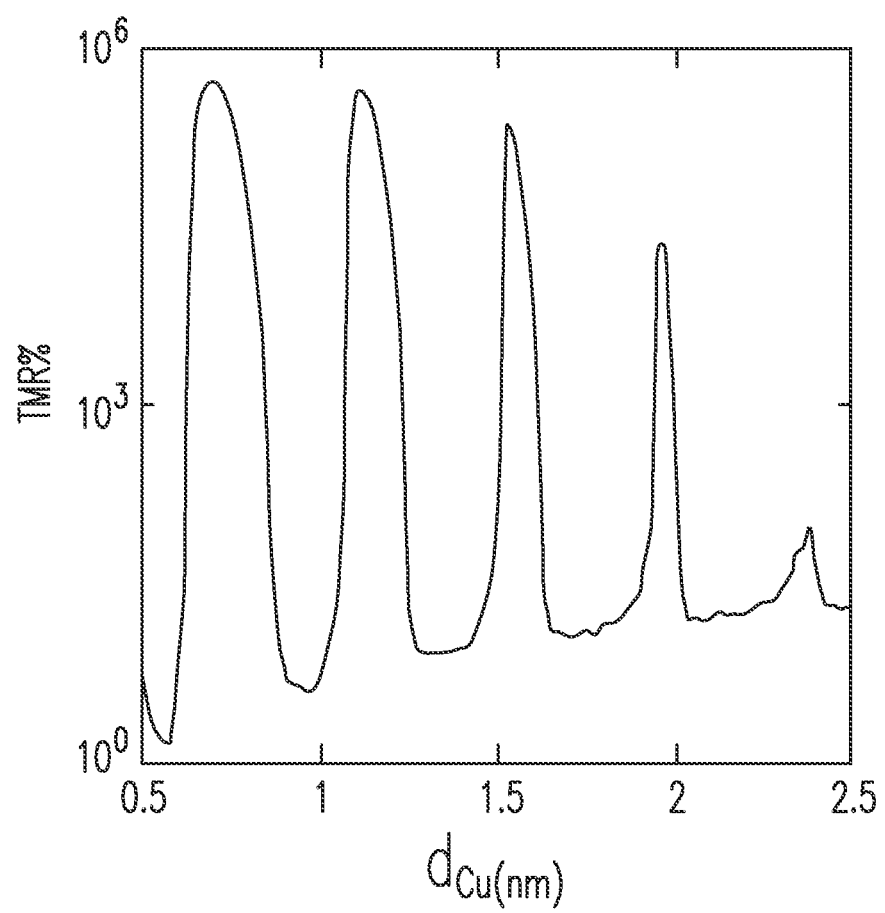
FIG. 3 shows the tunnel magnetoresistance ratio (TMR %) of a magnetic tunnel junction with a superlattice barrier as a function of the thickness $d_{Cu}$ of the nonmagnetic metal in the superlattice barrier.

FIG. 3 shows the tunnel magnetoresistance ratio (TMR %) of a magnetic tunnel junction (MTJ) with a superlattice barrier (SLB). The structure of the SLB is [nonmagnetic metal/insulator]$^N$, where N=3. The nonmagnetic metal is Cu, and the thickness of the insulator layer is 0.5 nm. There are oscillations in the plot of the TMR % as a function of the thickness of the Cu layer $d_{Cu}$, as shown in FIG. 3. When $d_{Cu}$=0.7 nm, TMR %≈5×10$^5$%.

In general, the superlattice barrier (SLB) includes at least two multilayer cells. For example, the structure of the SLB in the MTJ whose TMR % is shown in FIG. 3 is [nonmagnetic metal/insulator]$^N$, where [nonmagnetic metal/insulator] is a multilayer cell (there are two layers inside the multilayer cell: a nonmagnetic metal layer and an insulator layer). The SLB in the MTJ whose TMR % is shown in FIG. 3 consists of three multilayer cells. Generally, the stacked pinned layer, the at least two multilayer cells in the superlattice barrier and the free layer are aligned along a line, which is defined as a horizontal line. Each of the at least two multilayer cells includes at least one barrier layer and at least one potential well layer, alternately stacked to each other horizontally, wherein the barrier layer is one of an insulator material and a semiconductor material, and the potential well layer is one of a conductor material and a semiconductor material. Again, take the SLB in the MTJ whose TMR % is shown in FIG. 3 as an example. Each of the three multilayer cells of the superlattice barrier has a barrier layer which is an insulator material, and a potential well layer which is a nonmagnetic metal (i.e., a conductor material).

Preferably, the conductor material of the potential well layer is either a nonmagnetic metal (e.g., Ta, Ru, Cr, Al, Mg, Cu, Ti or Pt) or a magnetic metal (e.g., NiFe, NiFeCo, CoFe, CoFeB, Fe, Co, Ni). The insulator material of the barrier layer can be $Al_2O_3$, $SiO_2$, $Ta_2O_5$, $SiN_4$, $AlN_x$ or MgO. The semiconductor material can be a single element semiconductor (e.g., C, Si, Ge), a compound semiconductor (e.g., SiC, GaAs, GaN, ZnO) or an alloy semiconductor (e.g., AlGaAs, AlInAs, CdMnTe, AlGaAsP).

The magnetic tunnel junction may include one or more buffer layers. The buffer layer is located in one selected from a position group consisting of being between the superlattice barrier and the pinned layer, between the superlattice barrier and the free layer, and between the at least two multilayer cells. The following are a few embodiments of the superlattice barrier with and without the buffer layers.

Figure 4:
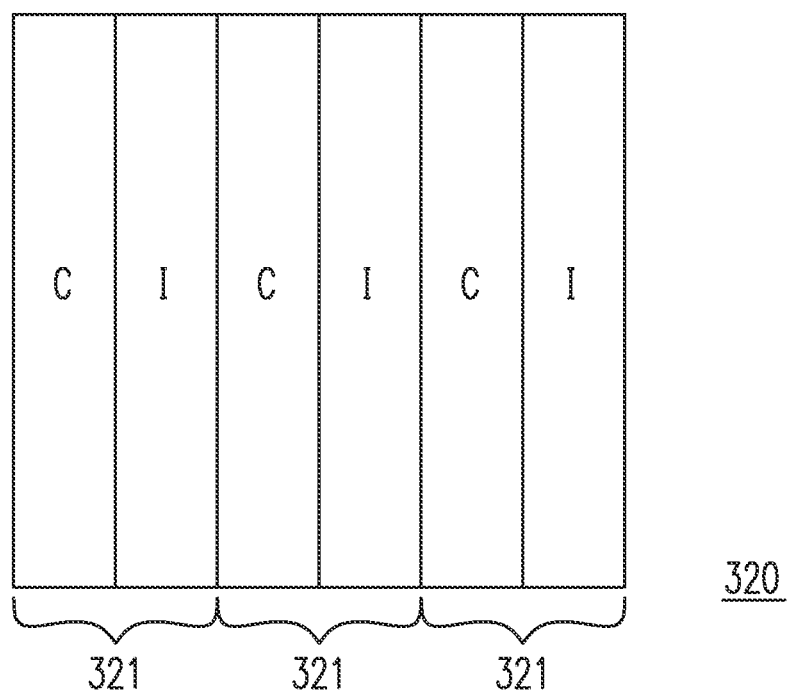
FIG. 4 shows an embodiment of the superlattice barrier.

Please refer to FIG. 4, which shows an embodiment of the superlattice barrier. The superlattice barrier 320 consists of three multilayer cells 321 horizontally stacked to form a periodic structure. Each of the multilayer cells 321 consists of a conductor material C and an insulator material I horizontally stacked.

Figure 5:
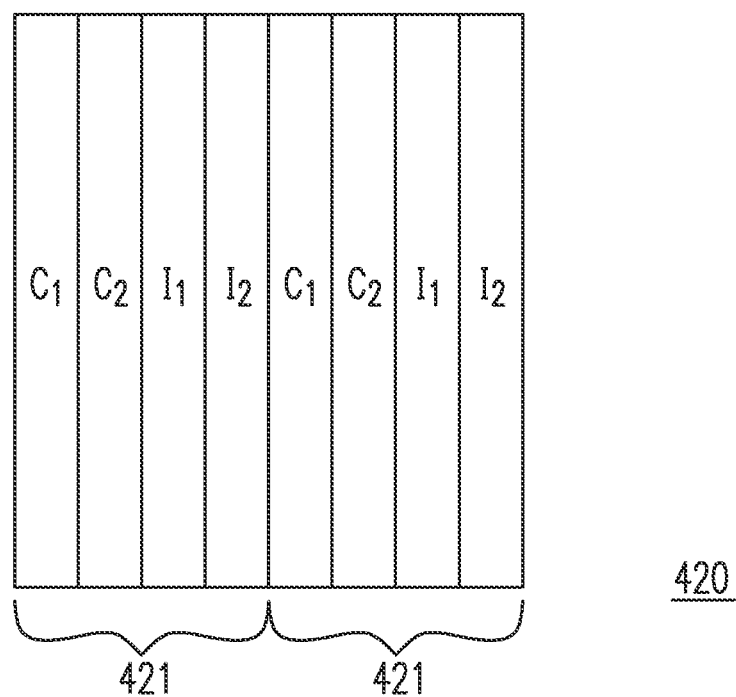
FIG. 5 shows another embodiment of the superlattice barrier.

Please refer to FIG. 5, which shows another embodiment of the superlattice barrier. The superlattice barrier 420 consists of two multilayer cells 421 horizontally stacked to form a periodic structure. Each of the multilayer cells 421 consists of a first conductor material $C_1$, a second conductor material $C_2$, a first insulator material $I_1$ and a second insulator material $I_2$ horizontally stacked.

Figure 6:
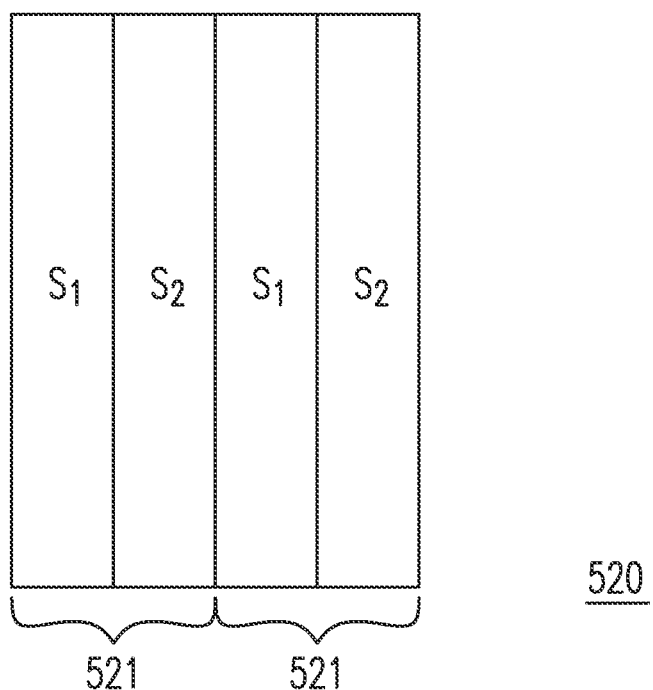
FIG. 6 shows another embodiment of the superlattice barrier.

Please refer to FIG. 6, which shows another embodiment of the superlattice barrier. The superlattice barrier 520 consists of two multilayer cells 521 horizontally stacked to form a periodic structure. Each of the multilayer cells 521 consists of a first semiconductor material $S_1$ and a second semiconductor material $S_2$ horizontally stacked.

Figure 7:
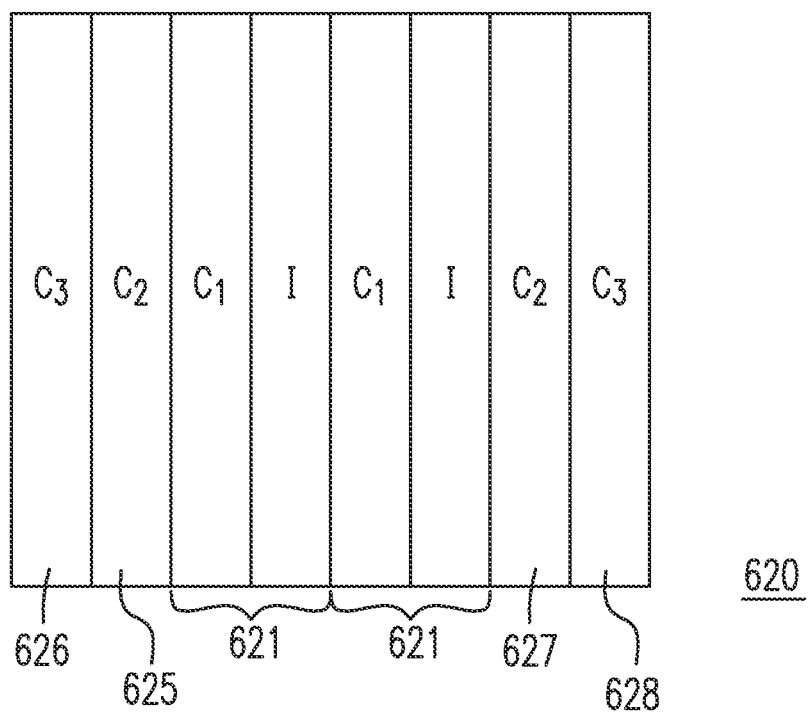
FIG. 7 shows an embodiment of the superlattice barrier including buffer layers.

Please refer to FIG. 7, which shows an embodiment of the superlattice barrier including buffer layers. The superlattice barrier 620 includes two multilayer cells 621 horizontally stacked to form a quasi-periodic structure. Each of the multilayer cells 621 consists of a first conductor material $C_1$ and an insulator material I horizontally stacked. On the left side of the leftmost (with the assumption that the horizontal direction runs from left to right, the leftmost can also be called the innermost) multilayer cell 621, there are a first buffer layer 625 consisting of a second conductor material $C_2$ and a second buffer layer 626 consisting of a third conductor material $C_3$ stacked along the reverse horizontal direction. On the right side of the rightmost (or, outermost) multilayer cell 621, there are a third buffer layer 627 consisting of the second conductor material $C_2$ and a fourth buffer layer 628 consisting of the third conductor material $C_3$ stacked along the horizontal direction. Generally, the structure of the superlattice barrier can be either periodic or quasi-periodic. For example, "ABABAB" can be a superlattice barrier, while "ABDAB" and "CABABD" can also be superlattice barriers.

Figure 8:
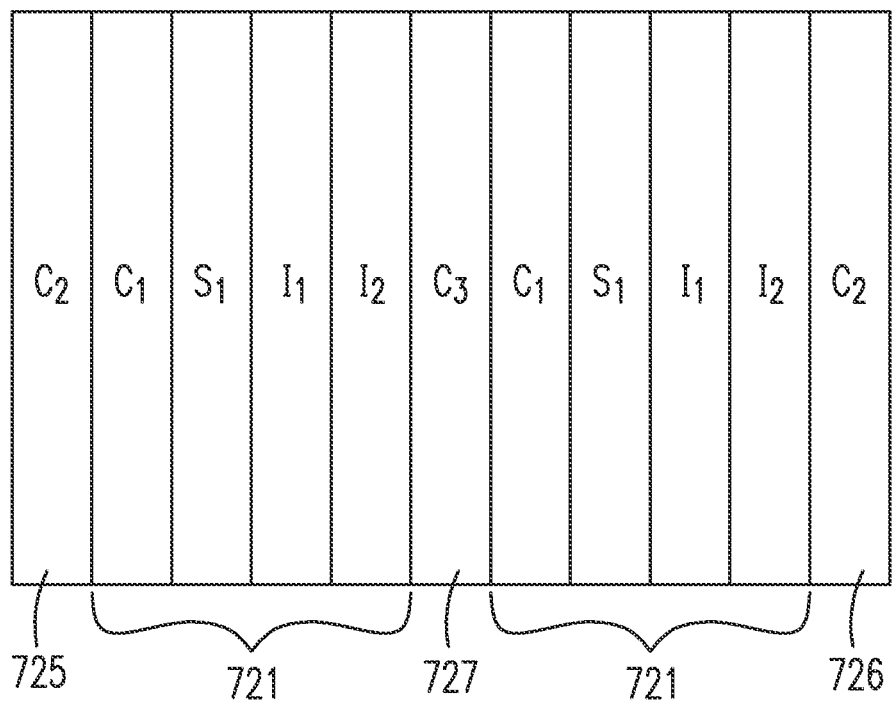
FIG. 8 shows another embodiment of the superlattice barrier including buffer layers.

Please refer to FIG. 8, which shows another embodiment of the superlattice barrier including buffer layers. The superlattice barrier 720 includes two multilayer cells 721 horizontally stacked to form a quasi-periodic structure. Each of the multilayer cells 721 consists of a first conductor material $C_1$, a first semiconductor material $S_1$, a first insulator material $I_1$ and a second insulator material $I_2$ horizontally stacked. On the left side of the leftmost (or, innermost) multilayer cell 721, there is a first buffer layer 725 consisting of a second conductor material $C_2$. On the right side of the rightmost (or, outermost) multilayer cell 721, there is a second buffer layer 726 consisting of the second conductor material $C_2$. Between the two multilayer cells 721 there is a third buffer layer 727 consisting of a third conductor material $C_3$.

Figure 9:
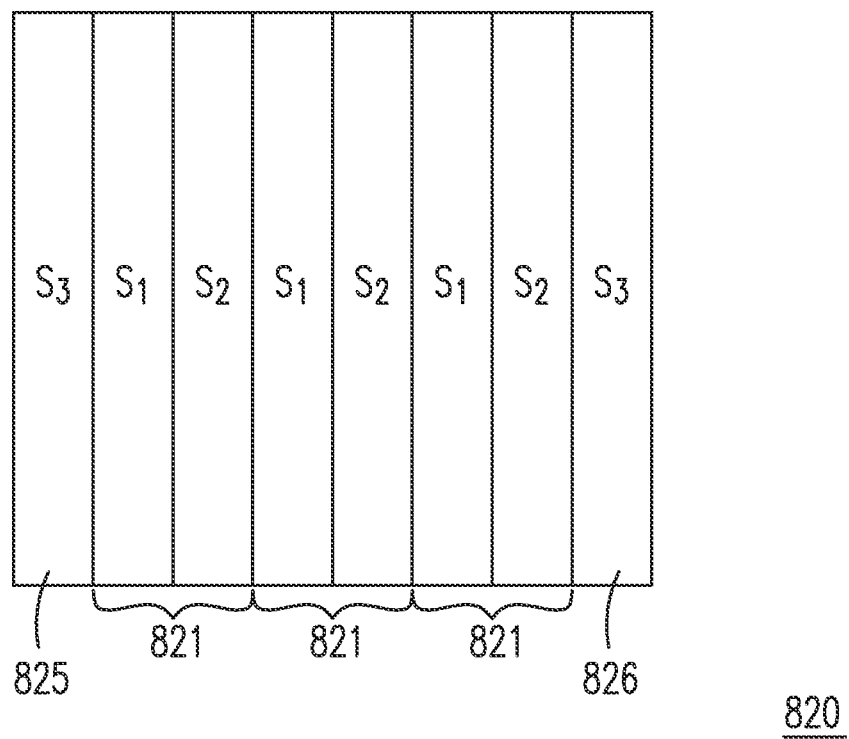
FIG. 9 shows another embodiment of the superlattice barrier including buffer layers.

Please refer to FIG. 9, which shows another embodiment of the superlattice barrier including buffer layers. The superlattice barrier 820 includes three multilayer cells 821 horizontally stacked to form a quasi-periodic structure. Each of the multilayer cells 821 consists of a first semiconductor material $S_1$ and a second semiconductor material $S_2$ horizontally stacked. On the left side of the leftmost (or, innermost) multilayer cell 821, there is a first buffer layer 825 consisting of a third semiconductor material $S_3$. On the right side of the rightmost (or, outermost) multilayer cell 821, there is a second buffer layer 826 consisting of the third semiconductor material $S_3$.

Figure 10:
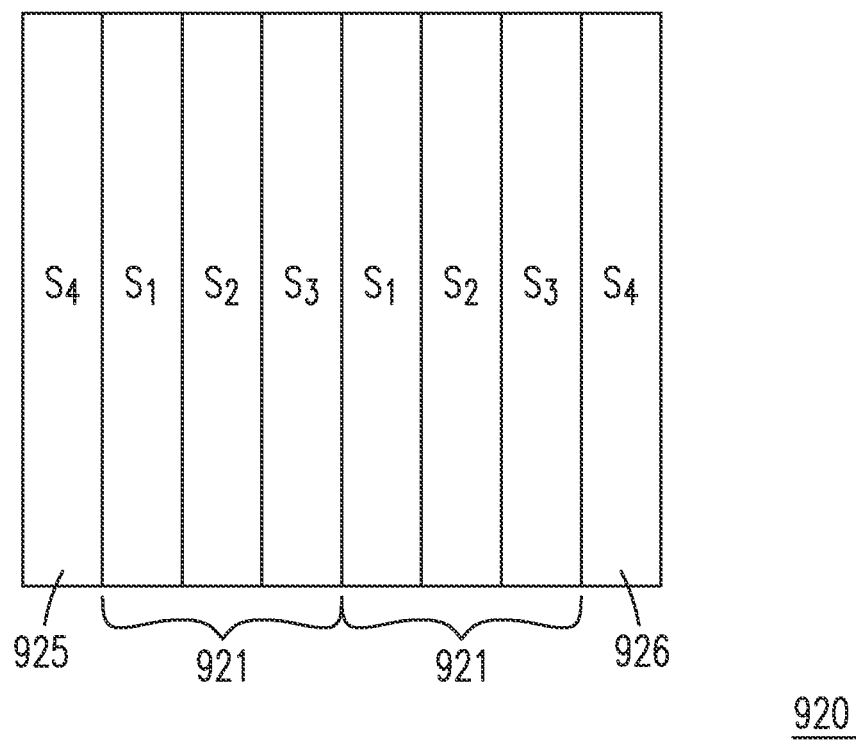
FIG. 10 shows another embodiment of the superlattice barrier including buffer layers.

Please refer to FIG. 10, which shows another embodiment of the superlattice barrier including buffer layers. The superlattice barrier 920 includes two multilayer cells 921 horizontally stacked to form a quasi-periodic structure. Each of the multilayer cells 921 consists of a first semiconductor material $S_1$, a second semiconductor material $S_2$ and a third semiconductor material $S_3$ horizontally stacked. On the left side of the leftmost (or, innermost) multilayer cell 921, there is a first buffer layer 925 consisting of a fourth semiconductor material $S_4$. On the right side of the rightmost (or, outermost) multilayer cell 921, there is a second buffer layer 926 consisting of the fourth semiconductor material $S_4$.

Figure 11:
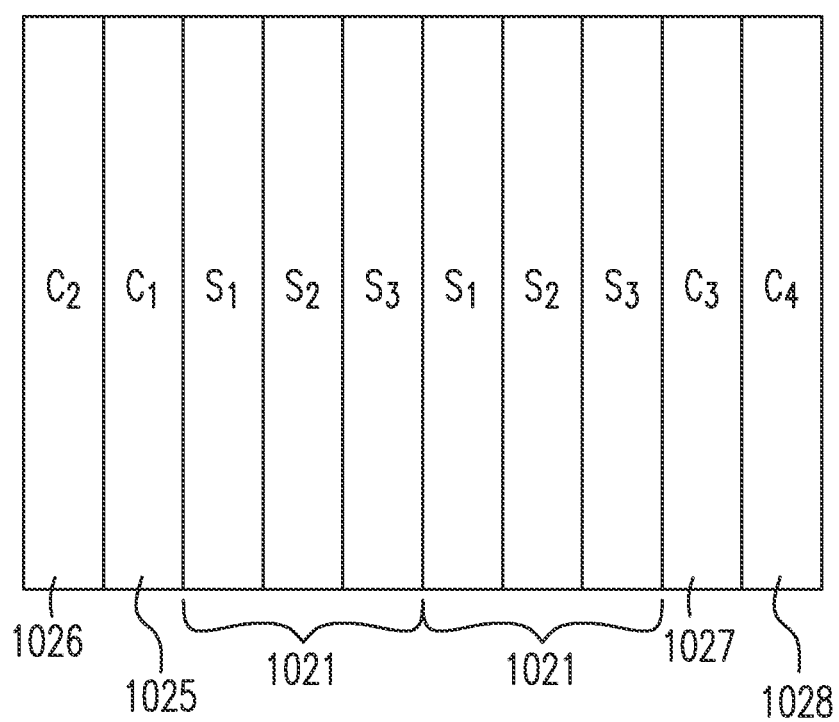
FIG. 11 shows another embodiment of the superlattice barrier including buffer layers.

Please refer to FIG. 11, which shows another embodiment of the superlattice barrier including buffer layers. The superlattice barrier 1020 includes two multilayer cells 1021 horizontally stacked to form a quasi-periodic structure. Each of the multilayer cells 1021 consists of a first semiconductor material $S_1$, a second semiconductor material $S_2$ and a third semiconductor material $S_3$ horizontally stacked. On the left side of the leftmost (or, innermost) multilayer cell 1021, there are a first buffer layer 1025 consisting of a first conductor material $C_1$ and a second buffer layer 1026 consisting of a second conductor material $C_2$ stacked along the reverse horizontal direction. On the right side of the rightmost (or, outermost) multilayer cell 1021, there are a third buffer layer 1027 consisting of a third conductor material $C_3$ and a fourth buffer layer 1028 consisting of a fourth conductor material $C_4$ stacked along the horizontal direction.

Figure 12:
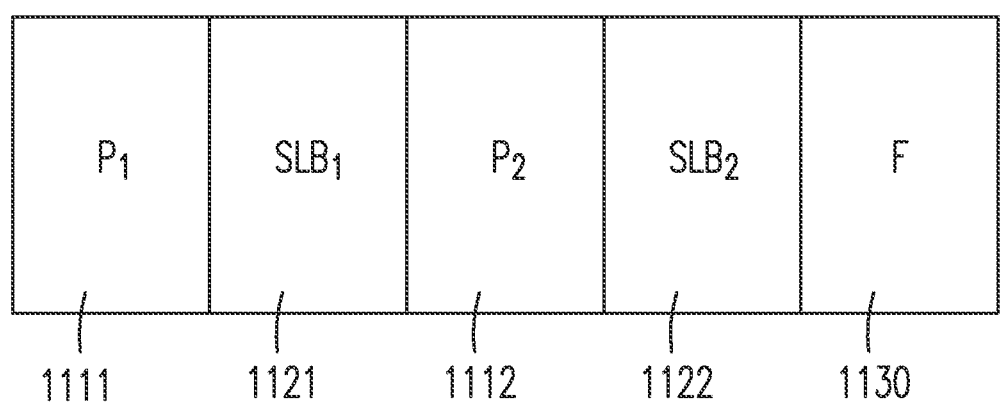
FIG. 12 shows another embodiment of the magnetic tunnel junction of the present invention.

Please refer to FIG. 12, which shows another embodiment of the magnetic tunnel junction of the present invention. The magnetic tunnel junction 1100 includes a first pinned layer 1111, a first superlattice barrier 1121, a second pinned layer 1112 and a second superlattice barrier 1122 horizontally stacked. On the right side (which can be called the outer side) of the rightmost (or, outermost) superlattice barrier 1122, there is a free layer 1130. This embodiment can be seen as the series connection of the basic form of the magnetic tunnel junction of the present invention. The plurality of barriers are alternately stacked in pairs with the plurality of pinned layers. The number of such pairs may be greater than 2. All the possible series connections are variations of this embodiment, as long as one of the barriers in the series is a superlattice barrier.

Figure 13:
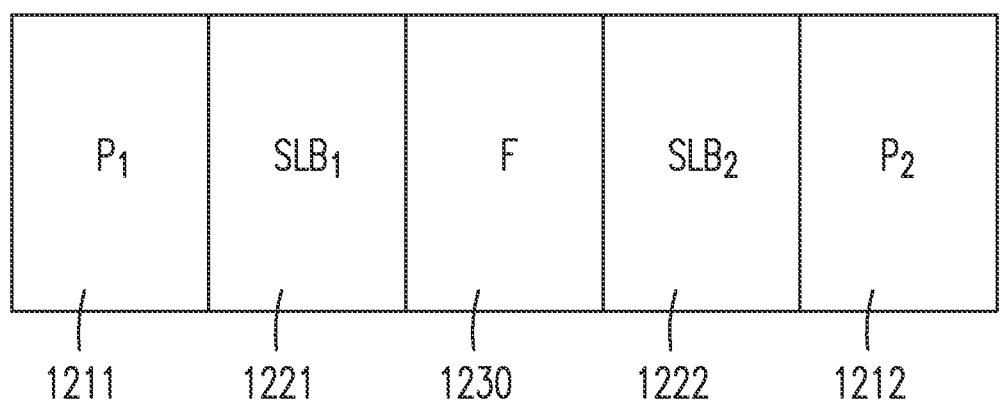
FIG. 13 shows another embodiment of the magnetic tunnel junction of the present invention.

Please refer to FIG. 13, which shows another embodiment of the magnetic tunnel junction of the present invention. The magnetic tunnel junction 1200 includes a first pinned layer 1211, a first superlattice barrier 1221, a free layer 1230, a second superlattice barrier 1222 and a second pinned layer 1212 horizontally stacked. This embodiment can be seen as the parallel connection of the basic form of the magnetic tunnel junction of the present invention and may have many variations. There can be the combination of series and parallel connections. All the possible combinations are variations of this invention, as long as one of the barriers is a superlattice barrier.

Figure 14:
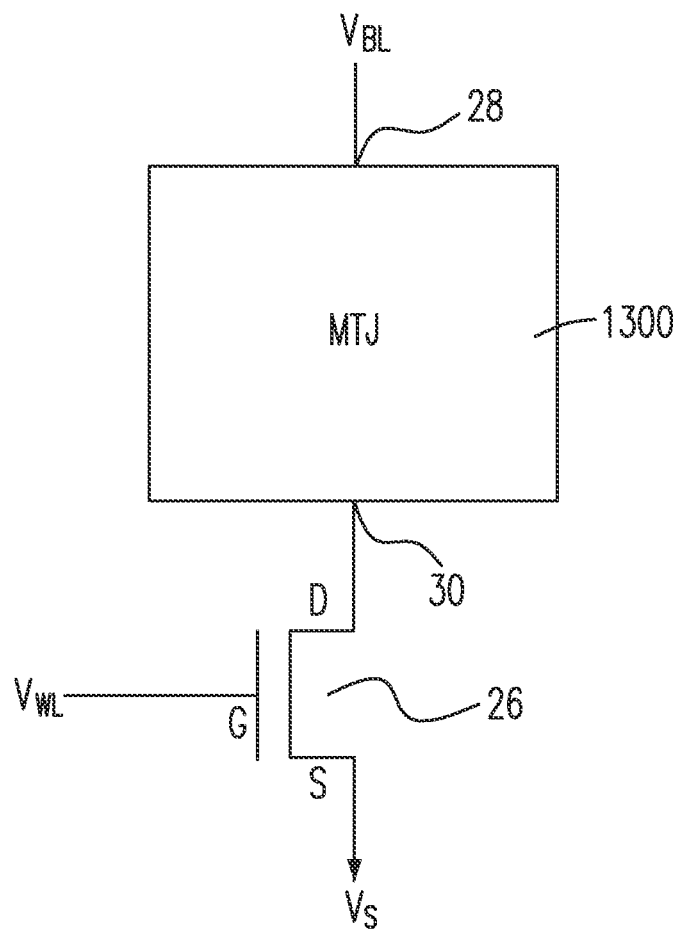
FIG. 14 shows an embodiment of the magnetic random access memory bit cell including the magnetic tunnel junction of the present invention.

Please refer to FIG. 14, which shows an embodiment of the magnetic random access memory bit cell including the magnetic tunnel junction of the present invention. Please note that, in FIG. 14, the direction of the magnetic tunnel junction 1300 is rotated 90° from the direction of the magnetic tunnel junctions in FIG. 1B, FIG. 2B and FIGS. 4-13. In FIG. 14, the source S of transistor 26 is coupled to a voltage source $V_S$. The drain D of transistor 26 can be coupled to the pinned layer of the magnetic tunnel junction 1300 through a bottom electrode 30, while a bit line $V_{BL}$ is coupled to the free layer of the magnetic tunnel junction 1300 through a top electrode 28. When reading the data stored in the magnetic tunnel junction 1300, the bit line $V_{BL}$ is activated to allow current to flow through the magnetic tunnel junction 1300. A small resistance value is measured when the magnetization directions of the free layer and the pinned layer are the same (called "parallel", and a memory state, e.g., a logical "0," is thus formed.). The measured resistance is the voltage applied to the bit line $V_{BL}$ divided by a measured current. When the magnetizations of the free layer and the pinned layer of the magnetic tunnel junction 1300 are in opposite directions (called "anti-parallel", and another memory state, e.g., a logical "1," is thus formed.), a higher resistance is measured. In other words, the magnetic random access memory utilizes the difference in magnetoresistance values between parallel and anti-parallel states to store digital logical 0 and logical 1. The magnetic tunnel junction of the present invention can substantially increase the difference in magnetoresistance values, represented by TMR %. When writing data to the magnetic tunnel junction 1300, the gate G of transistor 26 is activated by activating the write line $V_{WL}$. There is a voltage differential between the bit line $V_{BL}$ and $V_S$. The voltage differential results in a write current between the drain D and the source S. To change the magnetization directions from anti-parallel to parallel, a write current flowing from the free layer to the pinned layer has to be generated. A spin transfer torque (STT) at the free layer is thus induced to change the magnetization direction of the free layer from anti-parallel to parallel. To change the magnetization direction from parallel to anti-parallel, a write current flowing from the pinned layer to the free layer has to be generated. A spin transfer torque at the free layer is thus induced to change the magnetization direction of the free layer to be anti-parallel to that of the pinned layer. The drain D of transistor 26 can also be coupled to the free layer of the magnetic tunnel junction 1300, while the bit line $V_{BL}$ is coupled to the pinned layer of the magnetic tunnel junction 1300. In FIG. 14 the transistor is an NMOS transistor. However, transistors of other types can also be used in the design. The magnetic tunnel junction 1300 can be any of the magnetic tunnel junctions of the present invention.

Figure 15:
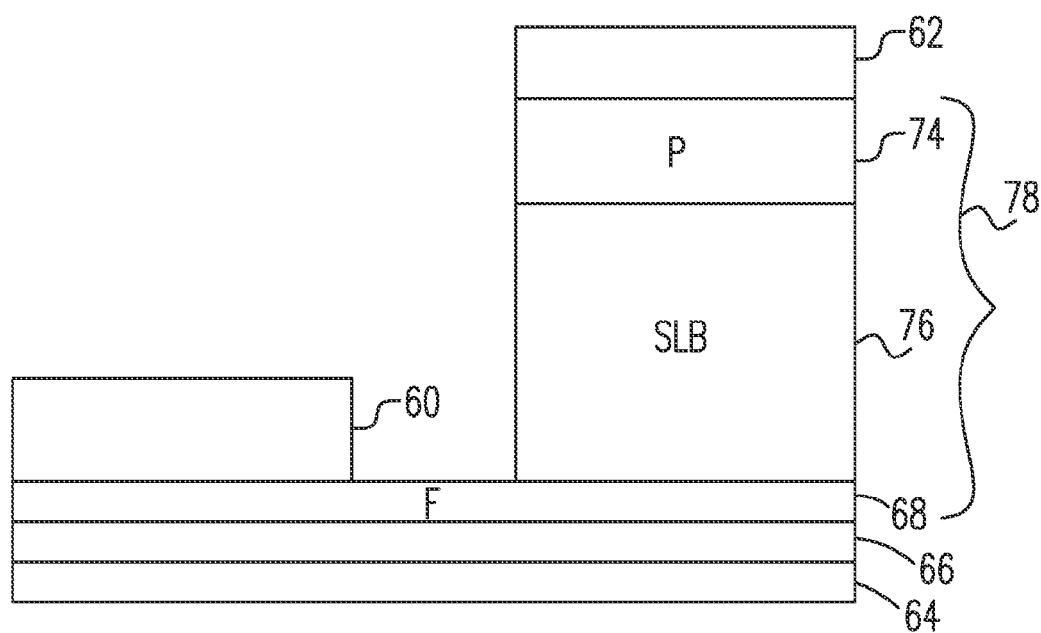
FIG. 15 shows an embodiment of the magnetic tunnel junction transistor device including the magnetic tunnel junction of the present invention.

Please refer to FIG. 15, which shows an embodiment of the magnetic tunnel junction transistor device including the magnetic tunnel junction of the present invention. FIG. 15 is a cross-sectional view of a magnetic tunnel junction transistor device, which has a first electrode 62, a gate electrode 64, and a magnetic tunnel junction 78 configured between the first electrode 62 and the gate electrode 64. In the embodiment shown in FIG. 15, between the magnetic tunnel junction 78 and the gate electrode 64, there is a gate dielectric layer 66 formed on the gate electrode 64. The first electrode 62 may be a drain or source electrode. The magnetic tunnel junction 78 includes a free layer 68 formed on top of the gate dielectric layer 66. On top of the free layer 68 is a superlattice barrier 76 and on top of the superlattice barrier 76 is a pinned layer 74. Another electrode 60 is either a source or drain electrode, different from the first electrode 62. The magnetization direction of the free layer may change with the applied voltage to the gate electrode. The magnetic tunnel junction 78 can be any of the magnetic tunnel junctions of the present invention.

Figure 16:
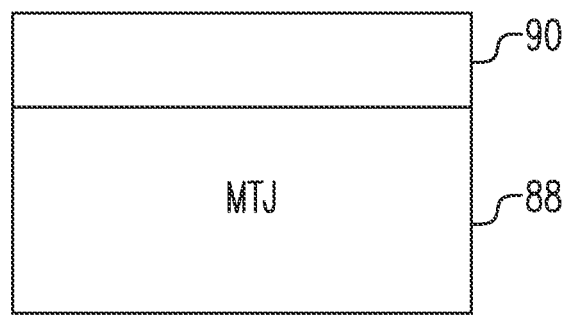
FIG. 16 shows an embodiment of the magnetic field sensor including the magnetic tunnel junction of the present invention.

Please refer to FIG. 16, which shows an embodiment of the magnetic field sensor including the magnetic tunnel junction of the present invention. In FIG. 16, due to the need of practical design, a capped layer 90 is formed on top of the magnetic tunnel junction 88. By measuring the magnetoresistance of the magnetic tunnel junction in the magnetic field sensor, the magnitude of an external magnetic field can be obtained. There is a wide range of applications for the magnetic field sensor, e.g., biomedical sensing, biochemical sensing, wheel speed sensing, angle measurement, linear displacement measurement, current measurement, geomagnetic detection applied in compass and navigation devices, and metal detection. The magnetic tunnel junction 88 can be any of the magnetic tunnel junctions of the present invention.

There are further embodiments provided as follows.

Embodiment 1: A magnetic tunnel junction comprising a plurality of pinned layers; a plurality of barriers, wherein at least one of the plurality of barriers is a superlattice barrier, the plurality of barriers are alternately stacked in pairs with the plurality of pinned layers, and an outermost barrier of the plurality of barriers has an outer side; and a free layer configured on the outer side.

Embodiment 2: A magnetic tunnel junction comprising a first part including a plurality of first pinned layers and a plurality of first barriers, wherein the plurality of first pinned layers and the plurality of first barriers are alternately stacked in pairs; a second part including a plurality of second pinned layers and a plurality of second barriers, wherein the plurality of second pinned layers and the plurality of second barriers are alternately stacked in pairs; and a free layer configured between the plurality of first barriers and the plurality of second barriers, wherein at least one of the plurality of first barriers and the plurality of second barriers is a superlattice barrier, and the first part, the free layer and the second part are horizontally stacked.

Embodiment 3: A magnetic random access memory bit cell comprising a transistor; and a magnetic tunnel junction connected to the transistor, wherein the magnetic tunnel junction includes a pinned layer, a free layer and a superlattice barrier configured between the pinned layer and the free layer.

Embodiment 4: The magnetic random access memory bit cell as claimed in Embodiment 3, wherein the superlattice barrier includes at least two multilayer cells, the at least two multilayer cells are horizontally stacked, and each of the at least two multilayer cells includes at least one barrier layer and at least one potential well layer, alternately stacked to each other horizontally, wherein the barrier layer is one of an insulator material and a semiconductor material, and the potential well layer is one of a conductor material and a semiconductor material.

Embodiment 5: A magnetic tunnel junction transistor device comprising a first electrode; a gate electrode; and a magnetic tunnel junction configured between the first electrode and the gate electrode and including a pinned layer, a free layer and a superlattice barrier configured between the pinned layer and the free layer.

Embodiment 6: The magnetic tunnel junction transistor device as claimed in Embodiment 5, wherein the superlattice barrier includes at least two multilayer cells, the at least two multilayer cells are horizontally stacked, and each of the at least two multilayer cells includes at least one barrier layer and at least one potential well layer, alternately stacked to each other horizontally, wherein the barrier layer is one of an insulator material and a semiconductor material, and the potential well layer is one of a conductor material and a semiconductor material.

Embodiment 7: A magnetic field sensor comprising a magnetic tunnel junction including a pinned layer, a free layer and a superlattice barrier configured between the pinned layer and the free layer.

Embodiment 8: The magnetic field sensor as claimed in Embodiment 7 further comprising a capped layer adjacent to the magnetic tunnel junction.

Embodiment 9: The magnetic field sensor as claimed in Embodiment 7 or 8, wherein the superlattice barrier includes at least two multilayer cells, the at least two multilayer cells are horizontally stacked, and each of the at least two multilayer cells includes at least one barrier layer and at least one potential well layer, alternately stacked to each other horizontally, wherein the barrier layer is one of an insulator material and a semiconductor material, and the potential well layer is one of a conductor material and a semiconductor material.

Embodiment 10: A magnetic tunnel junction comprising a pinned layer; a free layer; and a periodic middle layer having a plurality of layered units, and configured between the pinned layer and the free layer, wherein each of the plurality of layered units includes at least one barrier layer and at least one potential well layer.

Embodiment 11: A magnetic tunnel junction comprising a pinned layer; a free layer; and a superlattice barrier configured between the pinned layer and the free layer.

Embodiment 12: The magnetic tunnel junction as claimed in Embodiment 11, wherein either one of the pinned layer and the free layer is one of a ferromagnetic material and a semiconductor material.

Embodiment 13: The magnetic tunnel junction as claimed in any one of Embodiments 11-12, wherein the superlattice barrier includes at least two multilayer cells, and the at least two multilayer cells are horizontally stacked.

Embodiment 14: The magnetic tunnel junction as claimed in any one of Embodiments 11-13, wherein each of the at least two multilayer cells includes at least one barrier layer and at least one potential well layer, alternately stacked to each other horizontally, wherein the barrier layer is one of an insulator material and a semiconductor material, and the potential well layer is one of a conductor material and a semiconductor material.

Embodiment 15: The magnetic tunnel junction as claimed in any one of Embodiments 11-14, wherein each of the at least two multilayer cells includes at least one conductor layer and at least one insulator layer such that when the total number of the at least one conductor layer and the total number of the at least one insulator layer are both 1, the at least one conductor layer and the at least one insulator layer are horizontally stacked, and when at least one of the total number of the at least one conductor layer and the total number of the at least one insulator layer is no smaller than 2, the stacked at least one conductor layer and the stacked at least one insulator layer are horizontally stacked.

Embodiment 16: The magnetic tunnel junction as claimed in any one of Embodiments 11-15, wherein each of the at least two multilayer cells includes a plurality of semiconductor layers stacked horizontally.

Embodiment 17: The magnetic tunnel junction as claimed in any one of Embodiments 11-16, wherein each of the at least two multilayer cells includes at least one semiconductor layer and at least one of an insulator layer and a semiconductor layer all stacked sequentially and horizontally.

Embodiment 18: The magnetic tunnel junction as claimed in any one of Embodiments 11-17, further comprising a buffer layer, wherein the buffer layer is located in one selected from a position group consisting of being between the superlattice barrier and the pinned layer, between the superlattice barrier and the free layer, and between the at least two multilayer cells.

Embodiment 19: The magnetic tunnel junction as claimed in any one of Embodiments 11-18, wherein the pinned layer has a first magnetization direction, the first magnetization direction extends along a line on the plane of the pinned layer, and the magnetization direction of the free layer is one of being the same as and opposite to the first magnetization direction.

Embodiment 20: The magnetic tunnel junction as claimed in any one of Embodiments 11-19, wherein the pinned layer has a first magnetization direction extending along a line perpendicular to the plane of the pinned layer, and the magnetization direction of the free layer is one of being the same as and opposite to the first magnetization direction.

While the invention has been described in terms of what is presently considered to be the most practical and preferred embodiments, it is to be understood that the invention needs not be limited to the disclosed embodiments. Therefore, it is intended to cover various modifications and similar configuration included within the spirit and scope of the appended claims, which are to be accorded with the broadest interpretation so as to encompass all such modifications and similar structures.

What is claimed is:

1. A magnetic tunnel junction, comprising:
a pinned layer;
a free layer; and
a superlattice barrier configured between the pinned layer and the free layer, wherein the superlattice barrier includes at least two multilayer cells and has a leftmost layer and a rightmost layer, the at least two multilayer cells are horizontally stacked, each of the at least two multilayer cells includes at least one insulator layer and at least one conductor layer, the leftmost layer is one of an insulator layer and a conductor layer, and the rightmost layer is the other one of the insulator layer and the conductor layer.

2. The magnetic tunnel junction as claimed in claim 1, wherein either one of the pinned layer and the free layer is one of a ferromagnetic material and a semiconductor material.

3. The magnetic tunnel junction as claimed in claim 1, wherein when the total number of the at least one conductor layer and the total number of the at least one insulator layer are both 1, the at least one conductor layer and the at least one insulator layer are horizontally stacked, and when at least one of the total number of the at least one conductor layer and the total number of the at least one insulator layer is no smaller than 2, the stacked at least one conductor layer and the stacked at least one insulator layer are horizontally stacked.

4. The magnetic tunnel junction as claimed in claim 1, further comprising a buffer layer, wherein the buffer layer is located in one selected from a position group consisting of being between the superlattice barrier and the pinned layer, between the superlattice barrier and the free layer, and between the at least two multilayer cells.

5. The magnetic tunnel junction as claimed in claim 1, wherein the pinned layer has a first magnetization direction, the first magnetization direction extends along a line on the plane of the pinned layer, and the magnetization direction of the free layer is one of being the same as and opposite to the first magnetization direction.

6. The magnetic tunnel junction as claimed in claim 1, wherein the pinned layer has a first magnetization direction extending along a line perpendicular to the plane of the pinned layer, and the magnetization direction of the free layer is one of being the same as and opposite to the first magnetization direction.

\* \* \* \* \*